(12) United States Patent
Ishii

(10) Patent No.: US 7,088,083 B2
(45) Date of Patent: Aug. 8, 2006

(54) SWITCHING REGULATOR

(75) Inventor: Toshiki Ishii, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 11/129,800

(22) Filed: May 16, 2005

(65) Prior Publication Data

US 2006/0076941 A1    Apr. 13, 2006

(30) Foreign Application Priority Data

May 17, 2004    (JP)    .............................. 2004-146049

(51) Int. Cl.
*G05F 1/40*    (2006.01)
(52) U.S. Cl. .................................................. 323/282
(58) Field of Classification Search ................ 323/276, 323/282, 283, 284; 361/18
See application file for complete search history.

(56) References Cited

U.S. PATENT DOCUMENTS

| | | | |
|---|---|---|---|
| 6,163,142 A * | 12/2000 | Tsujimoto | 323/283 |
| 6,300,750 B1 * | 10/2001 | Oglesbee et al. | 323/282 |
| 6,580,253 B1 * | 6/2003 | Kanakubo et al. | 323/222 |
| 6,847,231 B1 * | 1/2005 | Kinugawa et al. | 326/82 |

* cited by examiner

*Primary Examiner*—Adolf Berhane
(74) *Attorney, Agent, or Firm*—Adams & Wilks

(57) ABSTRACT

The present invention provides a short-circuit protecting circuit of a switching regulator which does not require a capacitor having a large capacity in order to obtain a sufficient duty time. A pulse generating circuit for generating one clock with a short-circuit detection signal as a trigger signal is added, and a counter circuit for counting clock pulses of a clock signal is further inserted between a comparator and a latch circuit, whereby it becomes possible to produce a sufficient delay time based on a signal having a short period using a capacitor having a small capacity.

5 Claims, 2 Drawing Sheets

SWITCHING REGULATOR

BACKGROUND OF THE INVENTION

1. Field of the Invention

The present invention relates to a switching regulator having a short-circuit protecting circuit in a semiconductor integrated circuit device.

2. Description of the Related Art

An electronic system having as a power supply a switching regulator is widely used. When a short-circuit state is caused by the connection of an excessive load to an output terminal of a switching regulator due to some reasons, an excessive current is caused to flow through the switching regulator to break down the switching regulator. To prevent the short circuit, the switching regulator is provided with a short-circuit protecting circuit for protecting short-circuit breakdown.

The short-circuit protecting circuit of the switching regulator outputs a short-circuit signal after a short-circuit state caused in the switching regulator continues for a predetermined time period. The predetermined time period is a delay time required to prevent a malfunction such as stop of a system due to noises.

FIG. 2 shows a short-circuit protecting circuit of a conventional switching regulator. The short-circuit protecting circuit includes a constant current circuit 101, a capacitor 102, an NMOS transistor 103, a comparator 104, a short-circuit state detecting circuit 107, a latch circuit 108, and a reference voltage source 109.

The short-circuit state detecting circuit 107 is designed such that when a load applied to the switching regulator is normal, i.e., the switching regulator is in a nonshort-circuit state, a detection signal "HIGH" is outputted. Thus, the NMOS transistor 103 holds an ON state, and a voltage level at a noninverting terminal of the comparator 104 is "LOW". Hence, a level of an output signal from the comparator 104 is held at "LOW", and the latch circuit 108 is reset to a level "LOW".

When the switching regulator becomes a short-circuit state, the short-circuit state detecting circuit 107 outputs a signal "LOW", and thus the NMOS transistor 103 is turned OFF. When the voltage level at the noninverting terminal of the comparator 104 gradually increases from "LOW" and exceeds a reference voltage after a lapse of a delay time determined depending on the constant current circuit 101 and the capacitor 102, the level of the output signal from the comparator 104 changes from "LOW" to "HIGH". Then, the latch circuit 108 is set at a level "HIGH" to output a short-circuit signal. An output current limiting circuit (not shown) of the switching regulator is activated in accordance with the short-circuit signal, thereby preventing the short-circuit breakdown of the switching regulator. Note that when the short-circuit state is ended, the latch circuit 108 is reset to a level "LOW" in accordance with a reset signal (not shown) and the short-circuit signal disappears (refer to JP 2001-94407 A).

However, in the short-circuit protecting circuit of the conventional switching regulator, a time point when an inverted signal is inputted to the comparator 104 after the capacitor 102 is charged with electricity is regarded as a time point when the short-circuit signal is generated. Hence, in order to obtain a long delay time, it is necessary to increase a capacity of the capacitor 102. Since it is difficult to build a capacitor having a large capacity in a semiconductor integrated circuit, an outside capacitor is required to obtain a predetermined delay time. This is an obstacle to miniaturization of the system.

SUMMARY OF THE INVENTION

In order to solve the above-mentioned problem, a pulse generating circuit in which an inverted signal after the capacitor 102 is charged with electricity is used as a trigger signal, and a counter circuit for counting pulses from the pulse generating circuit are inserted between the comparator and the latch circuit.

More specifically, according to the present invention, there is provided a switching regulator having a short-circuit protecting circuit including a delay circuit, a latch circuit, and a short-circuit state detecting circuit, the short-circuit protecting circuit further including a pulse generating circuit and a counter circuit, in which the delay circuit is activated based on a signal from the short-circuit detecting circuit; after a lapse of a predetermined time period, the delay circuit activates the pulse generating circuit to cause the pulse generating circuit to output a pulse signal to the counter circuit; and when a predetermined count is satisfied, the counter circuit outputs a signal to the latch circuit, and the latch circuit outputs a short-circuit signal.

In addition, the delay circuit includes a constant current circuit, a capacitor connected to the constant current circuit, and a comparator for receiving as its input a reference voltage and a voltage of the capacitor to compare the voltage of the capacitor with the reference voltage. The electric charges accumulated in the capacitor are discharged in accordance with a signal from the short-circuit protecting circuit, and next, a current is caused to flow from the constant current circuit to the capacitor. The comparator detects that the voltage of the capacitor has reached the reference voltage, and activates the pulse generating circuit.

Pulses of the pulse signal having a short period obtained by utilizing the capacitor having a small capacity are counted, thereby allowing a desired long delay time to be produced. Thus, one-chip miniaturization of an IC for controlling the switching regulator becomes possible.

DETAILED DESCRIPTION OF THE PREFERRED EMBODIMENTS

First Embodiment

Figure 1:
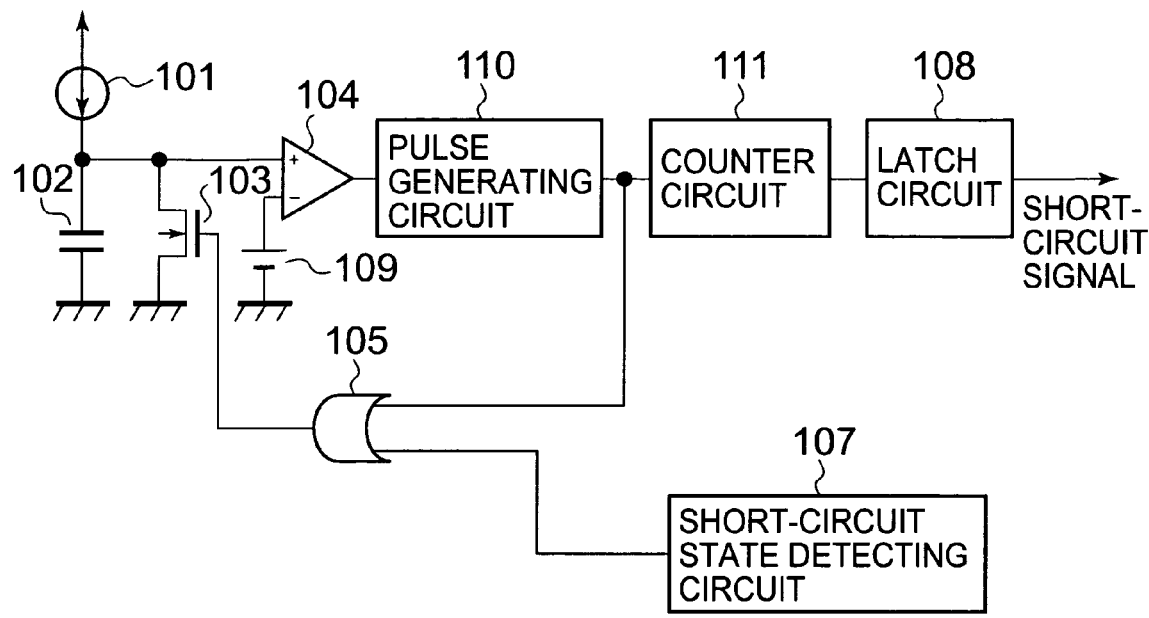
FIG. 1 is a circuit diagram, partly in block, showing a configuration of a short-circuit protecting circuit of a switching regulator according to a first embodiment of the present invention.

FIG.1 is a circuit diagram, partly in block, showing a configuration of a short-circuit protecting circuit of a switching regulator according to a first embodiment of the present invention. The short-circuit protecting circuit includes a constant current circuit 101, a capacitor 102, an NMOS transistor 103, a comparator 104, and a reference voltage source 109 which constitute a delay circuit, an OR gate 105, a short-circuit state detecting circuit 107, a latch circuit 108, a pulse generating circuit 110, and a counter circuit 111.

Figure 2:
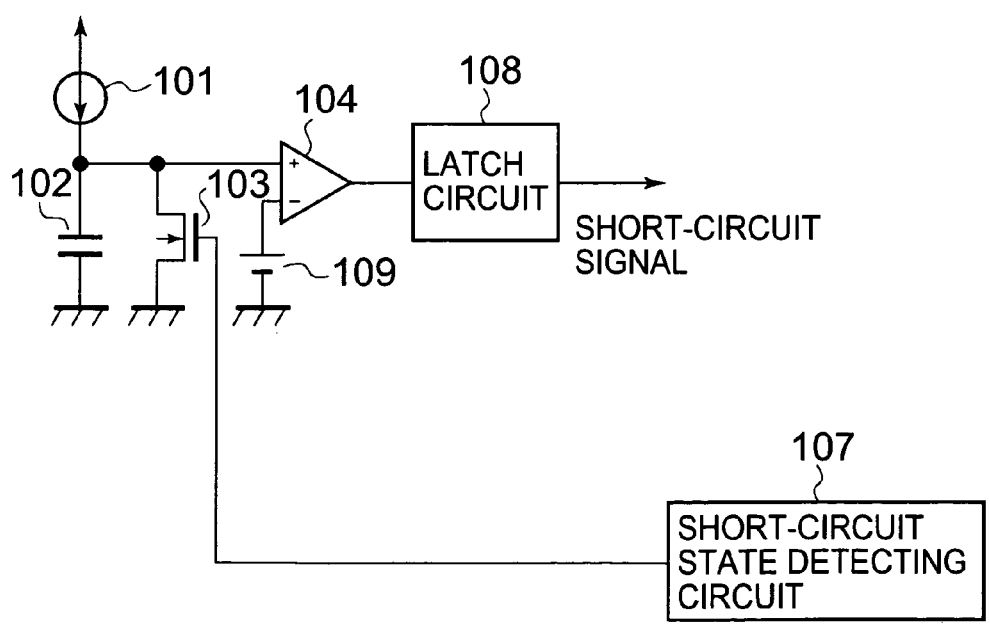
FIG. 2 is a circuit diagram, partly in block, showing a configuration of a short-circuit protecting circuit of a conventional switching regulator.

The OR gate 105 receives as its input an output signal from the short-circuit state detecting circuit 107 and an output signal from the pulse generating circuit 110. The pulse generating circuit 110 is reset to a level "LOW", and outputs a positive pulse having a pulse width $T_p$ only when it is triggered with an inverted signal from the comparator 104. The counter circuit 111 is reset to a level "LOW", and outputs a signal "HIGH" when it counts the number of positive pulses and the predetermined number of pulses is satisfied. Other constituent elements have the same functions as those of the constituent elements of the short-circuit protecting circuit of the conventional switching regulator shown in FIG. 2.

When a load applied to the switching regulator is normal and thus the switching regulator is in a nonshort-circuit state, the OR gate 105 for receiving as its input the output signal from the short-circuit state detecting circuit 107 and the output signal from the pulse generating circuit 110 outputs an output signal "HIGH". Hence, the NMOS transistor 103 holds an ON state, and a voltage at a noninverting terminal of the comparator 104 is 0 V. As a result, an output signal from the latch circuit 108 is reset to a level "LOW".

When the switching regulator becomes a short-circuit state, since a level of the output signal from the short-circuit state detecting circuit 107 goes to "LOW", and thus a level of the output signal from the OR gate 105 goes to "LOW", the NMOS transistor 103 is turned OFF. When the voltage at the noninverting input terminal of the comparator 104 rises from the level "LOW" and after a lapse of a delay time determined depending on the constant current circuit 101 and the capacitor 102, exceeds the reference voltage, a level of an output voltage from the comparator 104 changes from "LOW" to "HIGH". The pulse generating circuit 110 is triggered with the output voltage at a level "HIGH". This is referred to as a first trigger.

The counter circuit 111 counts a positive pulse from the pulse generating circuit 110 as one pulse. At this time, the positive pulse from the pulse generating circuit 110 turns ON the NMOS transistor 103 through the OR gate 105. Hence, the electric charges accumulated in the capacitor 102 are lost, and the level of the output signal from the comparator 104 goes to "LOW". This is referred to as a first return.

A time period from appearance of a detection signal to the first return is a pulse period T of the pulse generating circuit 110. In addition, a pulse width $T_p$ of the positive pulse is set as equal to or longer than a time period $T_r$ until a level of the output signal from the comparator 104 returns back to "LOW". When the switching regulator also continues the short-circuit state after the first return, a level of the output signal from the short-circuit state detecting circuit 107 goes to "LOW", and thus the operation becomes a second return through a second trigger. When the number N, of repetition of this operation reaches a coefficient value determined in the counter circuit 111, the latch circuit 108 is set at a level "HIGH" to output a short-circuit signal. An output current limiting circuit (not shown) of the switching regulator is activated in accordance with the short-circuit signal, thereby preventing the short-circuit breakdown of the switching regulator. Note that when the short-circuit state is ended, the latch circuit 108 is reset to a level "LOW" in accordance with a reset signal (not shown), and thus the short-circuit signal disappears. Note that the desired delay time can be realized by determining a pulse period T of the pulse generating circuit 110 and the counting number N, in the counter circuit 111.

Figure 3:
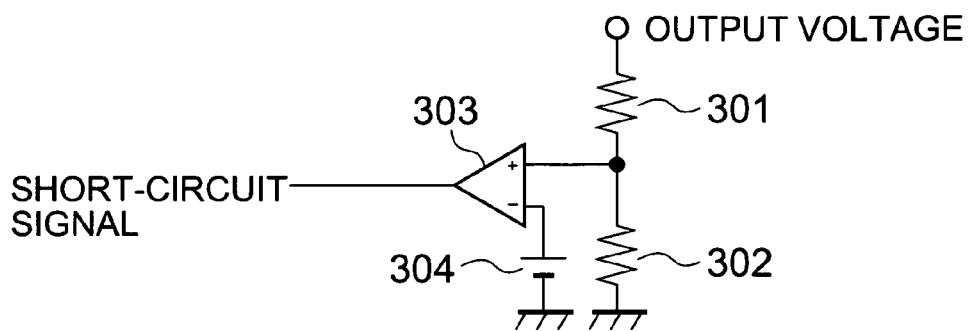
FIG. 3 is a circuit diagram showing a configuration of an embodiment of a short-circuit state detecting circuit of the short-circuit protecting circuit of the present invention.

FIG. 3 is a circuit diagram showing a configuration of an embodiment of the short-circuit state detecting circuit 107. The short-circuit state detecting circuit 107 includes division ratio setting resistors 301 and 302, a comparator 303, and a reference voltage circuit 304. In the short-circuit state detecting circuit 107, the comparator 303 compares a division voltage $V_b$ obtained by dividing an output voltage from the switching regulator through the division ratio setting resistors 301 and 302 with a reference voltage $V_r$ of the reference voltage circuit 304. When the division voltage $V_b$ becomes lower than the reference voltage $V_r$, the short-circuit state detecting circuit 107 outputs a short-circuit signal.

Second Embodiment

Figure 4:
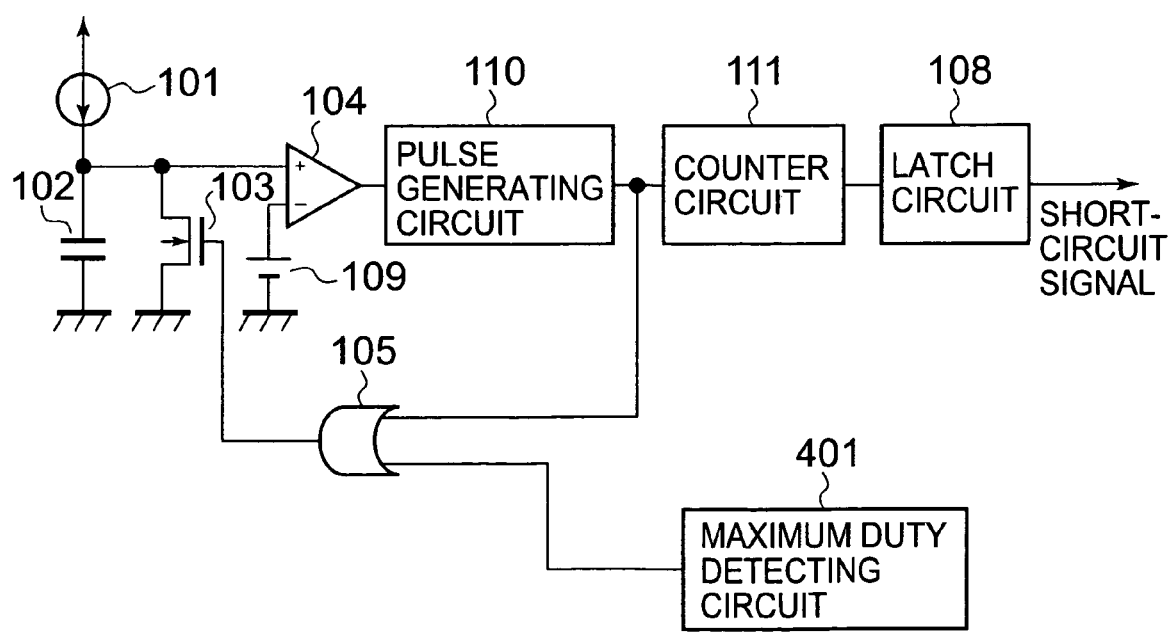
FIG. 4 is a circuit diagram, partly in block, showing a configuration of a short-circuit protecting circuit of a switching regulator according to a second embodiment of the present invention.

FIG. 4 is a circuit diagram, partly in block, showing a configuration of a short-circuit protecting circuit of a switching regulator according to a second embodiment of the present invention.

The second embodiment differs from the first embodiment in that the short-circuit state detecting circuit 107 is configured with a maximum duty detecting circuit 401.

The switching regulator under the pulse duty control increases or decreases a duty of a driving pulse (not shown) for a coil (not shown) in correspondence to a change in load when the load changes to output a predetermined constant voltage output. In general, when the load changes to a light load, the duty becomes small, while when the load changes to a heavy load, the duty becomes large, thereby supplying a desired constant voltage output. That is, when the short-circuit state is caused, the output voltage is reduced. Hence, the driving pulse having a maximum duty is outputted in order to output a predetermined output voltage.

Consequently, in the switching regulator under the pulse duty control, the maximum duty detecting circuit 401 detects a state in which the operation continues for a fixed time period at the maximum duty, thereby allowing the operation state to be detected as the short-circuit state.

While the short-circuit protecting circuit of the present invention used in the switching regulator has been described so far forth, the short-circuit protecting circuit of the present invention is not intended to be limited in use to the switching regulator. That is, even when the short-circuit protecting circuit of the present invention is used in a regulator such as a series regulator, it is possible to sufficiently provide the advantages of the present invention.

What is claimed is:

1. A switching regulator having a short-circuit protecting circuit, the short-circuit protecting circuit comprising:
a short-circuit state detecting circuit;
a delay circuit for delaying an output from the short-circuit state detecting circuit;
a pulse generating circuit for generating a pulse in response to an output from the delay circuit;
a counter circuit for counting pulses from the pulse generating circuit; and a latch circuit for latching an output from the counter circuit to output the latched output as a short-circuit signal.

2. A switching regulator having a short-circuit protecting circuit according to claim 1, wherein the short-circuit protecting circuit further comprising a logical circuit for receiving as its input a signal from the pulse generating circuit and a signal from the short-circuit state detecting circuit to output a logical sum thereof to the delay circuit.

3. A switching regulator having a short-circuit protecting circuit according to claim 1, wherein the delay circuit comprises:
- a constant current circuit;
- a capacitor connected to the constant current circuit;
- a comparator for comparing a voltage of the capacitor with a reference voltage; and
- a switching element for controlling charge/discharge of the capacitor based on an output from the short-circuit state detecting circuit.

4. A switching regulator having a short-circuit protecting circuit according to claim 1, wherein the short-circuit state detecting circuit detects reduction of an output voltage from the switching regulator to detect a short-circuit state of the switching regulator.

5. A switching regulator having a short-circuit protecting circuit according to claim 1, wherein the short-circuit state detecting circuit detects a maximum duty state of the switching regulator to detect a short-circuit state of the switching regulator.

* * * * *